(12) United States Patent
Gillespie (10) Patent No.: US 8,841,957 B2
(45) Date of Patent: Sep. 23, 2014

(54) APPLIANCE AND A METHOD FOR OPERATING A CONTROL PANEL OF THE SAME

(71) Applicant: General Electric Company, Schenectady, NY (US)

(72) Inventor: Timothy Andrew Gillespie, Louisville, KY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/747,919

(22) Filed: Jan. 23, 2013

(65) Prior Publication Data

US 2014/0203863 A1    Jul. 24, 2014

(51) Int. Cl.
*H03K 17/96*    (2006.01)
(52) U.S. Cl.
CPC .............................. *H03K 17/9618* (2013.01); *H03K 17/9622* (2013.01)
USPC .......................................... 327/517; 327/516

(58) Field of Classification Search
USPC .................................. 327/516, 517, 564, 565
See application file for complete search history.

(56) References Cited

U.S. PATENT DOCUMENTS

| 7,855,550 | B2 | 12/2010 | Huang | |
|---|---|---|---|---|
| 8,400,209 | B2 * | 3/2013 | Ujvari | 327/517 |
| 2011/0059778 | A1 | 3/2011 | Barras et al. | |
| 2012/0044161 | A9 | 2/2012 | Jeanneteau et al. | |

FOREIGN PATENT DOCUMENTS

CN    102047559    5/2011

\* cited by examiner

*Primary Examiner* — Hai L Nguyen
(74) *Attorney, Agent, or Firm* — Dority & Manning, P.A.

(57) ABSTRACT

Appliances with control panels and methods for operating the same are provided. The control panel includes a plurality of touch sensors. When an adjustment mechanism approaches the control panel, a sensitivity setting of the plurality of touch sensors is adjusted in order to assist with calculating a time interval or a velocity of the adjustment mechanism. With the velocity of the adjustment mechanism calculated, usage of the control panel can be improved.

19 Claims, 6 Drawing Sheets

APPLIANCE AND A METHOD FOR OPERATING A CONTROL PANEL OF THE SAME

FIELD OF THE INVENTION

The present subject matter relates generally to appliances and control panels for the same.

BACKGROUND OF THE INVENTION

Appliances generally include a control panel for permitting a user to input control commands to the appliance. The control panel can allow the user to adjust settings and/or conditions of the appliance. For example, on oven appliances, a control panel can permit a user to activate or deactivate the appliance, select a cooking temperature, or start and stop a timer.

Certain control panels include touch sensors, such as capacitive touch sensors, that trigger or activate when a user's finger touches the control panel. Utilizing such capacitive touch sensors, the control panel can increase or decrease an input by a certain amount each time the user's finger touches the control panel. However, such adjustments can be tedious when each adjustment is relatively small. The control panel can also rapidly change the input when the user's finger touches the control panel for an extended or prolonged period of time. However, accurately adjusting the input in such a manner can be difficult or unintuitive.

Accordingly, a control panel for an appliance with features for facilitating usage of the control panel would be advantageous.

BRIEF DESCRIPTION OF THE INVENTION

The present subject matter provides appliances with control panels and methods for operating the same. The control panel includes a plurality of touch sensors. When an adjustment mechanism approaches the control panel, a sensitivity setting of the plurality of touch sensors is adjusted in order to assist with calculating a time interval or a velocity of the adjustment mechanism. With the velocity of the adjustment mechanism calculated, usage of the control panel can be improved. Additional aspects and advantages of the invention will be set forth in part in the following description, or may be apparent from the description, or may be learned through practice of the invention.

In a first exemplary embodiment, a method for operating a control panel of an appliance is provided. The control panel has a plurality of touch sensors. The method includes adjusting a setting of at least one of the plurality of touch sensors to an increased sensitivity setting, receiving a first signal from the at least one of the plurality of touch sensors when an adjustment mechanism approaches the at least one of the plurality of touch sensors, changing the setting of the at least one of the plurality of touch sensors to a decreased sensitivity setting after the step of receiving, receiving a second signal from the at least one of the plurality of touch sensors when the adjustment mechanism touches the control panel at the at least one of the plurality of touch sensors, and calculating a velocity of the adjustment mechanism based upon a time interval, T, between the first signal and the second signal.

In a second exemplary embodiment, a method for operating a control panel of an appliance is provided. The control panel has a plurality of touch sensors. The method includes adjusting a setting of at least one of the plurality of touch sensors to an increased sensitivity setting, detecting an adjustment mechanism approaching the at least one of the plurality of touch sensors before the adjustment mechanism touches the control panel, changing the setting of at least one of the plurality of touch sensors to a decreased sensitivity setting after the step of detecting, sensing the adjustment mechanism touching the control panel at the at least one of the plurality of touch sensors, and determining a time interval, T, between the step of detecting and the step of sensing.

In a third exemplary embodiment, an appliance is provided. The appliance includes a control panel having a front surface and a back surface positioned opposite each other on the control panel. The control panel also has a plurality of capacitive touch sensors positioned at the back surface of the control panel. A controller is in communication with the plurality of capacitive touch sensors of the control panel. The controller is configured for adjusting a setting of at least one of the plurality of capacitive touch sensors to an increased sensitivity setting, receiving a first signal from the at least one of the plurality of capacitive touch sensors when a triggering mechanism approaches the front surface of the control panel, changing the setting of the at least one of the plurality of capacitive touch sensors to a decreased sensitivity setting after the step of receiving, receiving a second signal from the at least one of the plurality of capacitive touch sensors when the triggering mechanism touches the front surface of the control panel, and calculating a time interval, T, between the first signal and the second signal.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Figure 1:
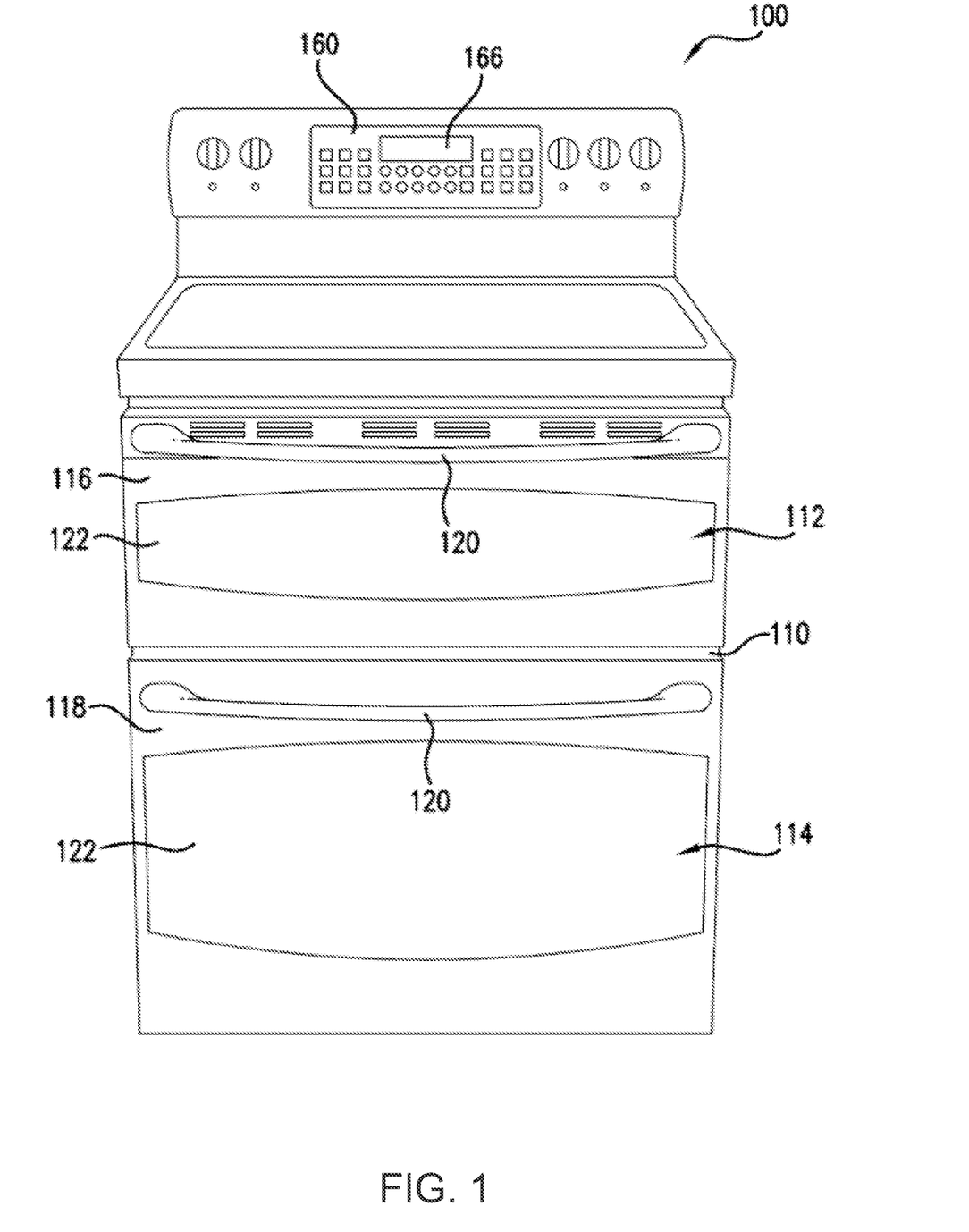
FIG. 1 provides a perspective view of a range appliance according to an exemplary embodiment of the present subject matter.
Figure 2:
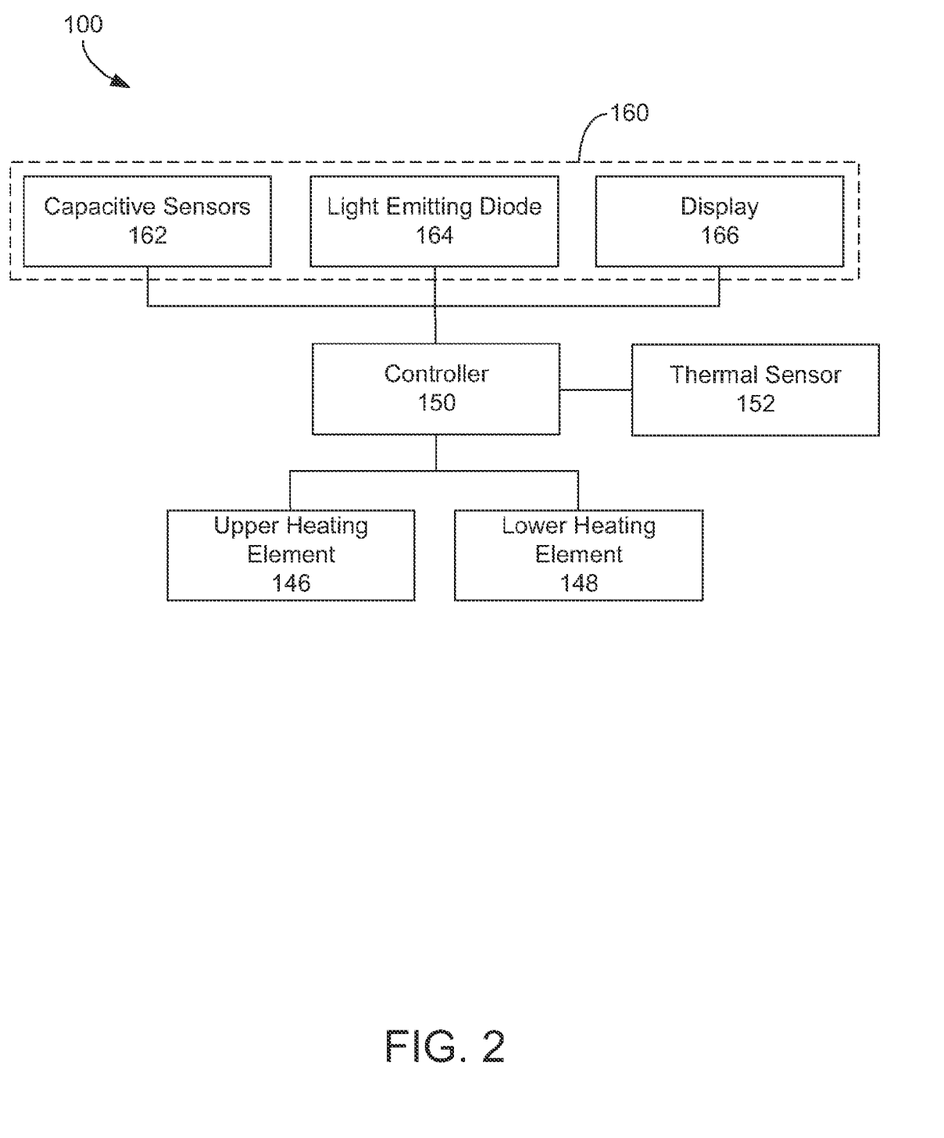
FIG. 2 provides a schematic view of the range appliance of FIG. 1.

FIG. 1 provides a perspective view of a range appliance 100 according to an exemplary embodiment of the present subject matter. FIG. 2 provides a schematic view of range appliance 100. As will be understood by those skilled in the art, range appliance 100 is provided by way of example only, and the present subject matter may be used in any suitable appliance, e.g., an oven appliance, a refrigerator appliance, a dishwasher appliance, a dryer appliance, and/or a washing machine appliance. Thus, the exemplary embodiment shown in FIG. 1 is not intended to limit the present subject matter in any aspect.

Range appliance 100 includes an insulated cabinet 110. Cabinet 110 defines an upper cooking chamber 112 and a lower cooking chamber 114. Thus, range appliance 100 is generally referred to as a double oven range appliance. Cooking chambers 112 and 114 are configured for the receipt of one or more food items to be cooked. Range appliance 100 includes an upper door 116 and a lower door 118 rotatably attached to cabinet 110, e.g., with a hinge (not shown), in order to permit selective access to upper cooking chamber 112 and lower cooking chamber 114, respectively. Handles 120 are mounted to upper and lower doors 116 and 118 to assist a user with opening and closing doors 116 and 118 in order to access cooking chambers 112 and 114. As an example, a user can pull on handle 120 mounted to upper door 116 to open or close upper door 116 and access upper cooking chamber 112. Glass window panes 122 provide for viewing the contents of upper and lower cooking chambers 112 and 114 when doors 116 and 118 are closed and also assist with insulating upper and lower cooking chambers 112 and 114.

An upper heating element 146 (FIG. 2) and a lower heating element 148 (FIG. 2) are positioned within upper cooking chamber 112 and lower heating chamber 114 of cabinet 110, respectively. Upper and lower heating elements 146 and 148 are used to heat upper cooking chamber 112 and lower heating chamber 114, respectively, for both cooking and cleaning of range appliance 100. The size and heat output of upper and lower heating elements 146 and 148 can be selected based on the e.g., the size of range appliance 100. Upper and lower heating elements 146 and 148 can include any suitable mechanism for heating oven appliance 100. For example, upper and lower heating elements 146 and 148 can include electric heating elements, microwave heating elements, halogen heating elements, or suitable combinations thereof.

Operation of the range appliance 100 is regulated by a controller 150 that is operatively coupled to a control panel 160. Control panel 160 includes touch sensors 162, light emitting diodes 164, and a display 166. Control panel 160 may be in communication with controller 150 via one or more signal lines or shared communication busses. Control panel 160 provides selections for user manipulation of the operation of range appliance 100. For example, a user can touch control panel 160 to trigger one of touch sensors 162 and signal controller 150. In response to user manipulation of touch sensors 162, controller 150 operates various components of the range appliance 100. For example, controller 150 is operatively coupled or in communication with upper and lower heating elements 146 and 148.

Light emitting diodes 164 can operate to indicate certain operations of range appliance 100 to a user. For example, light emitting diodes 164 can inform the user whether range appliance 100 is operating in a bake or broil mode. Similarly, display 166 can present information to an appliance user. For example, display 166 can show the current time or the operating temperature of upper and/or lower cooking chambers 112 and 114. Display 166 can be a liquid crystal display or any other suitable mechanism for displaying information to an appliance user.

Controller 150 is also in communication with a thermal sensor 152, e.g., a thermocouple or thermistor. Temperature sensor 152 may be positioned in one of upper and lower heating chambers 112 and 114. Controller 150 may receive a signal from temperature sensor 152 that corresponds to a temperature of upper heating chamber 112 and/or lower heating chamber 114.

Controller 150 includes memory and one or more processing devices such as microprocessors, CPUs or the like, such as general or special purpose microprocessors operable to execute programming instructions or micro-control code associated with operation of range appliance 100. The memory can represent random access memory such as DRAM, or read only memory such as ROM or FLASH. The processor executes programming instructions stored in the memory. The memory can be a separate component from the processor or can be included onboard within the processor. Alternatively, controller 150 may be constructed without using a microprocessor, e.g., using a combination of discrete analog and/or digital logic circuitry (such as switches, amplifiers, integrators, comparators, flip-flops, AND gates, and the like) to perform control functionality instead of relying upon software. Controller 150 may be positioned in a variety of locations throughout range appliance 100. Input/output ("I/O") signals may be routed between controller 150 and various operational components of range appliance 100, e.g., via one or more signal lines or shared communication busses.

Figure 3:
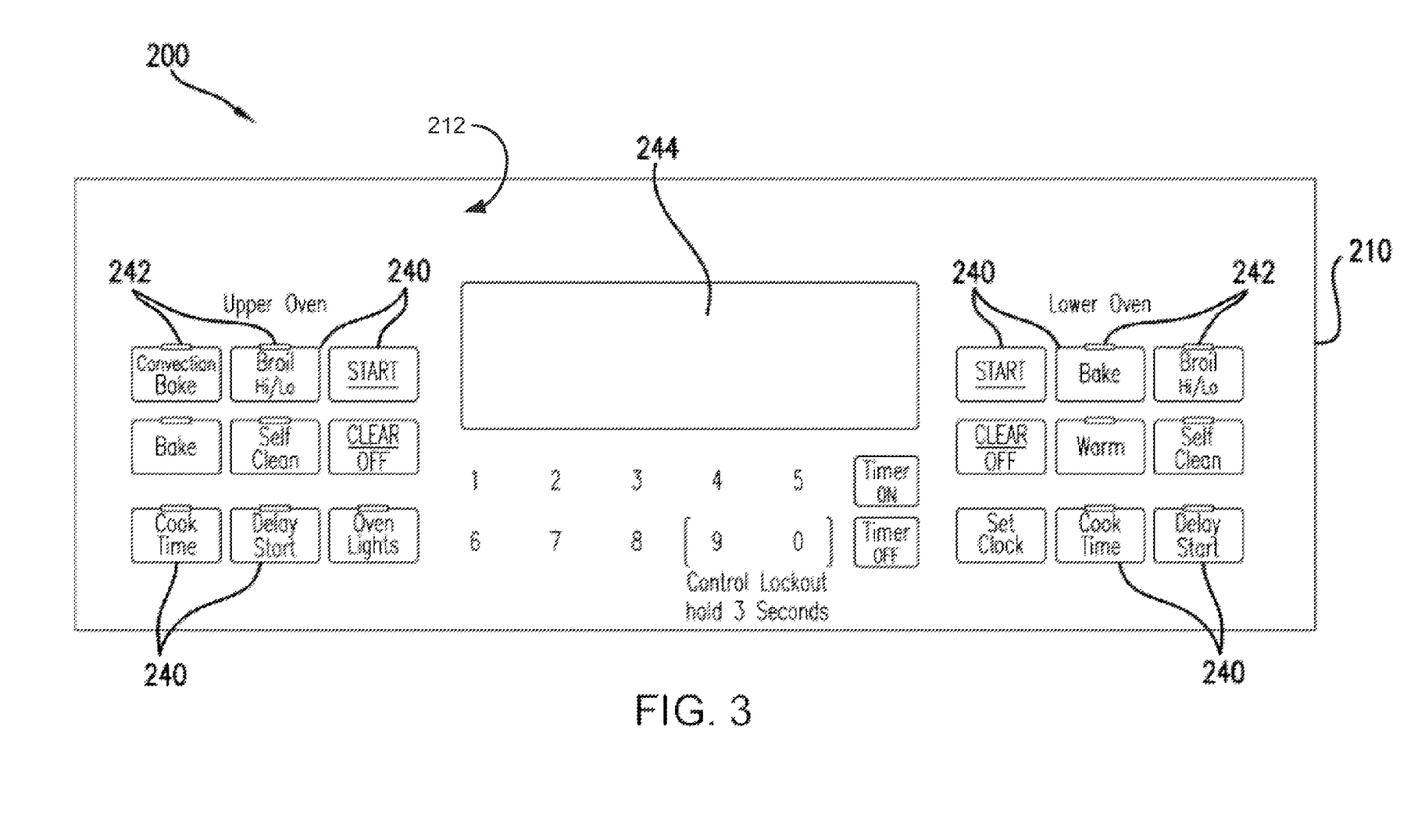
FIG. 3 provides a front, elevation view of a control panel according to an exemplary embodiment of the present subject matter.
Figure 4:
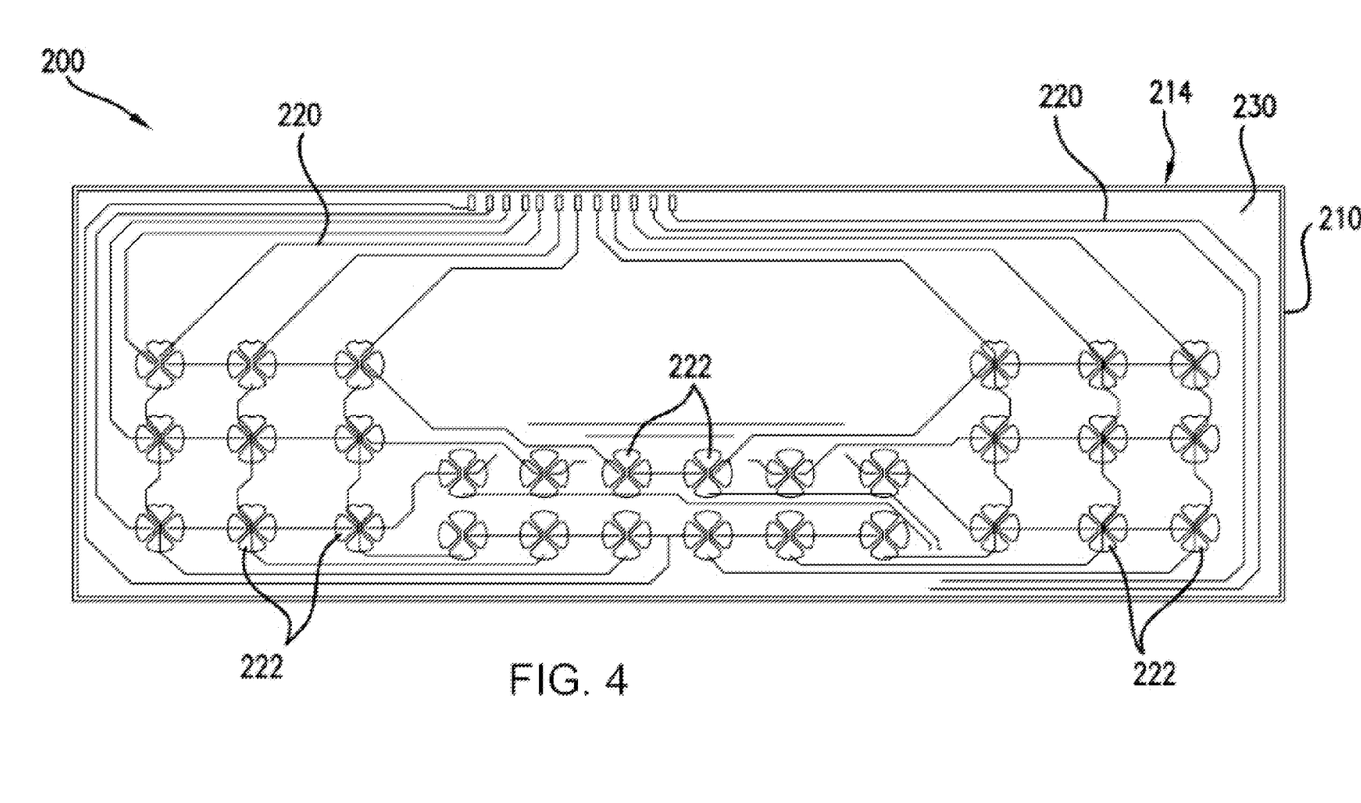
FIG. 4 provides a rear, elevation view of the control panel of FIG. 3.

FIG. 3 provides a front, elevation view of a control panel 200 according to an exemplary embodiment of the present subject matter. FIG. 4 provides a rear, elevation view of control panel 200. Control panel 200 is shown configured for use in a double oven range appliance, such as range appliance 100 (FIG. 1). However, as will be understood by those skilled in the art using the teachings disclosed herein, the present subject matter may be configured for use in any suitable appliance.

Control panel 200 includes a substrate 210 having a front surface 212 and a back surface 214. Front surface 212 of substrate 210 and back surface 214 of substrate 210 are positioned opposite each other on substrate 210. Substrate 210 may be constructed of any suitable material. For example, substrate 210 may be constructed of a dielectric material. Thus, substrate 210 may be constructed of glass or plastic, such as a transparent glass or plastic.

A plurality of touch sensors 222 are positioned at, e.g., adjacent or on, back surface 214 of substrate 210. Touch sensors 222 may be any suitable device for detecting a user touching substrate 210, e.g., front surface 212 of substrate 210. For example, touch sensors 222 may be capacitive touch sensors or resistive touch sensors.

Touch sensors 222 are configured for triggering when a trigger or adjustment mechanism, such as a finger or stylus, touches front surface 212 of substrate 210. As an example, touch sensors 222 can detect when a conductive material or any material with a dielectric different than air contacts substrate 210. For example, substrate 210 can be positioned on cabinet 110 such that front surface 212 of substrate 210 faces outwardly. When a user touches front surface 212 of substrate 210 adjacent one of touch sensors 222, e.g., with a finger, such touch sensor 222 triggers and, e.g., signals controller 150. In such a manner, operation of an appliance can be initiated and controlled.

Touch sensors 222 are also configured for triggering when the adjustment mechanism approaches front surface 212 of substrate 210. As an example, touch sensors 222 can detect when a conductive material or any material with a dielectric different than air approaches substrate 210. As discussed above, substrate 210 can be positioned on cabinet 110 such that front surface 212 of substrate 210 faces outwardly. When a finger of a user approaches front surface 212 of substrate 210 adjacent one of touch sensors 222, such touch sensor 222 triggers and, e.g., signals controller 150. Thus, the adjustment mechanism need not contact front surface 212 of substrate 210 to trigger an underlying touch sensor 222.

Control panel 200 further includes a plurality of appliance function indicators 240 positioned on substrate 210. Each one of appliance function indicators 240 can be positioned adjacent and correspond to one of touch sensors 222. Appliance function indicators 240 are visible on front surface 212 of substrate 210, e.g., in order to guide user operation of control panel 200. As an example, each appliance function indicator 240 can include a distinct message or symbol corresponding to the appliance function associated with the underlying touch sensor 222. Appliance function indicators 240 may be positioned directly on substrate 210. For example, appliance function indicators 240 may be printed or produced onto front surface 212 or back surface 214 of substrate 210.

Control panel 200 also includes light emitting diodes 242, e.g., light emitting diodes 164 (FIG. 2), mounted on back surface 214 of substrate 210 at respective ones of touch sensors 222. Light emitting diodes 242 can indicate or signal certain appliance operations. For example, light emitting diodes 242 can emit light when range appliance 100 is operating and upper and/or lower heating elements 146 and 148 are active.

Control panel 200 further includes a display 244, such as display 166, soldered onto back surface 214 of substrate 210. Display 244 can present information to an appliance user. For example, display 244 can show the current time or the operating temperature of upper and/or lower cooking chambers 112 and 114.

Figure 5:
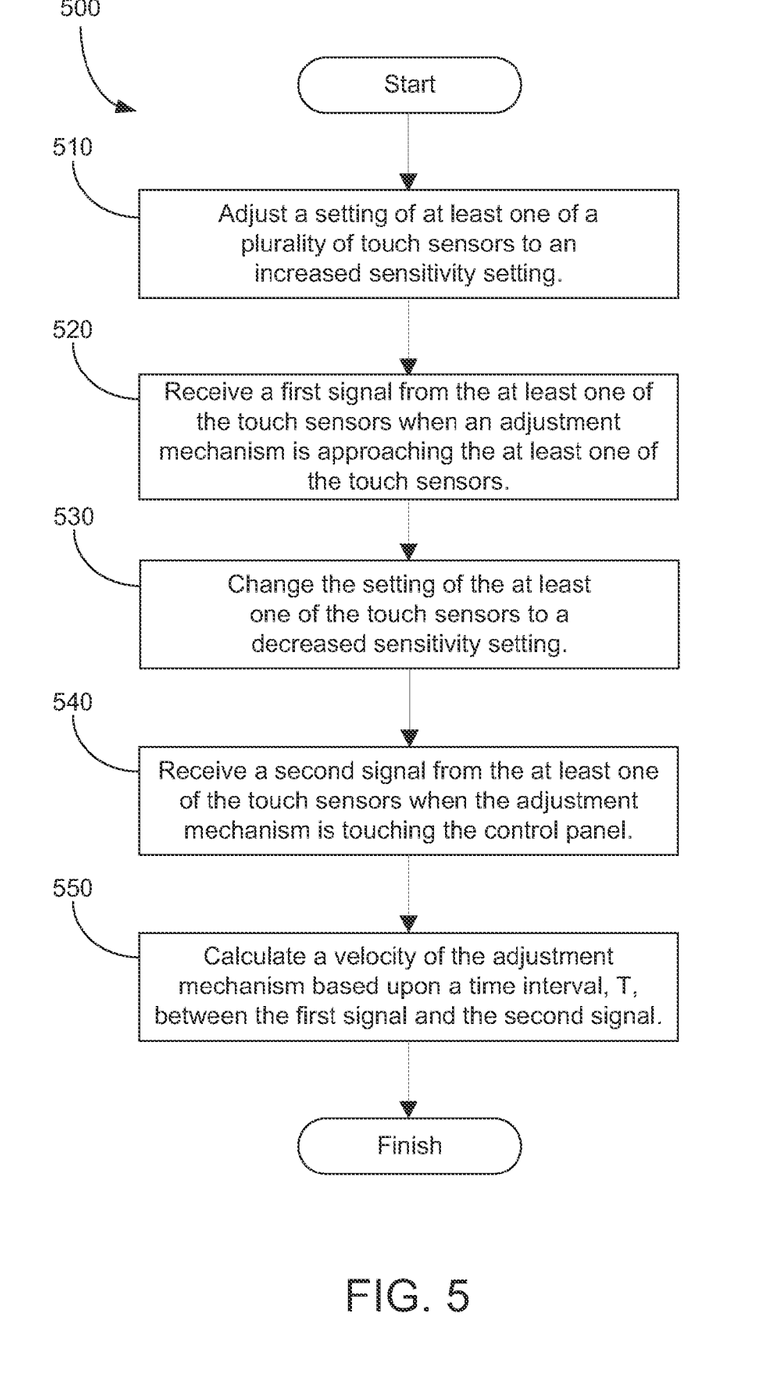
FIG. 5 illustrates a method for operating a control panel of an appliance according to an exemplary embodiment of the present subject matter.

FIG. 5 illustrates a method 500 for operating a control panel of an appliance according to an exemplary embodiment of the present subject matter. Method 500 can be utilized to operate any suitable control panel, such as control panel 200 (FIG. 2) or control panel 160 (FIG. 1). As an example, method 500 can be implemented by controller 150. Utilizing method 500, usage of control panel 200 can be improved as discussed in greater detail below.

At step 510, a controller, such as controller 150 (FIG. 2), adjusts a setting of at least one of touch sensors 222 to a high or increased sensitivity setting. In the increased sensitivity setting, touch sensors 222 detect or trigger when an adjustment mechanism, such as a finger or stylus, approaches control panel 200. Thus, the adjustment mechanism need not touch front surface 212 of substrate 210 to trigger touch sensors 222 in the increased sensitivity setting.

At step 520, the controller receives a first signal from the at least one of touch sensors 222. The controller receives the first signal when an adjustment mechanism approaches the at least one of touch sensors 222, e.g., because the at least one of touch sensors 222 is in the increased sensitivity setting. As discussed above, the adjustment mechanism need not touch front surface 212 of substrate 210 to trigger touch sensors 222 in the increased sensitivity setting. Thus, at step 520, the at least one of touch sensors 222 detects the adjustment mechanism approaching control panel 200, e.g., the at least one of touch sensors 222, when the adjustment mechanism is a distance D away from control panel 200 because the at least one of touch sensors 222 is in the increased sensitivity setting. Distance D can be any suitable distance away from substrate 210, e.g., front surface 212 of substrate 210. For example, distance D can be about six inches, about four inches, about two inches, about one inch, about half an inch, or less.

At step 530, the controller changes the setting of the at least one of touch sensors 222 to a low or decreased sensitivity setting after step 520. Thus, after the controller has detected the adjustment mechanism and received first signal, the controller changes the setting of the at least one of touch sensors 222 to the decreased sensitivity setting. In the decreased sensitivity setting, touch sensors 222 detect or trigger when the adjustment mechanism contacts control panel 200. Thus, the adjustment mechanism has to touch front surface 212 of substrate 210 to trigger touch sensors 222 in the decreased sensitivity setting.

At step 540, the controller receives a second signal from the at least one of touch sensors 222. The controller receives the second signal when the adjustment mechanism touches control panel 200, e.g., front surface 212 of substrate 210 at the at least one of the plurality of touch sensors. The controller receives the second signal at step 530 because the adjustment mechanism is touching control panel 200 and the at least one of touch sensors 222 is in the decreased sensitivity setting.

The controller can adjust or tune touch sensors 222 between the increased and decreased sensitivity settings in order to change how far the adjustment mechanism must be from control panel 200, e.g., front surface 212 of substrate 210, in order for touch sensors 222 to detect the adjustment mechanism. Further, the controller can rapidly or quickly adjust touch sensors 222 between the increased and decreased sensitivity settings, e.g., in order to calculating a velocity at which the adjustment mechanism is approaching control panel 200 as discussed in greater detail below.

At step 550, the controller calculates a velocity of the adjustment mechanism, e.g., as the adjustment mechanism approaches control panel 200 between steps 520 and 540. In particular, the controller calculates the velocity of the adjustment mechanism based upon a time interval T between the first signal of step 520 and the second signal of 540. As an example, the controller can determine time interval T by starting a timer of the controller after receiving the first signal at step 520 and stopping the timer after receiving the second signal at step 540. The controller can calculate the velocity of the adjustment mechanism by dividing distance D by time interval T, such that $$\text{Velocity} = \frac{D}{T}$$

With velocity of adjustment mechanism calculated at step 550, operation of control panel 200 can be improved. In particular, a rate of change for a control panel input can be adjusting based upon the velocity of the adjustment mechanism. The control panel input can be any suitable control command associated with a respective one of touch sensors 222. As an example, a bake temperature of upper cooking chamber 112 can be selected utilizing control panel 160. As will be understood by those skilled in the art, a user can trigger one of touch sensors 162 to increase a bake temperature. In particular, the user can touch control panel 160 to increase the bake temperature by a particular amount. Utilizing method 600, the particular amount can change and be selected based upon the velocity of the adjustment mechanism. In particular, a relatively high velocity can result in a relatively large increase in the bake temperature. Conversely, a relatively low velocity can result in a relatively small increase in bake temperature. Thus, the velocity of adjustment mechanism can be positively correlated to the rate of change for a control panel input.

Figure 6:
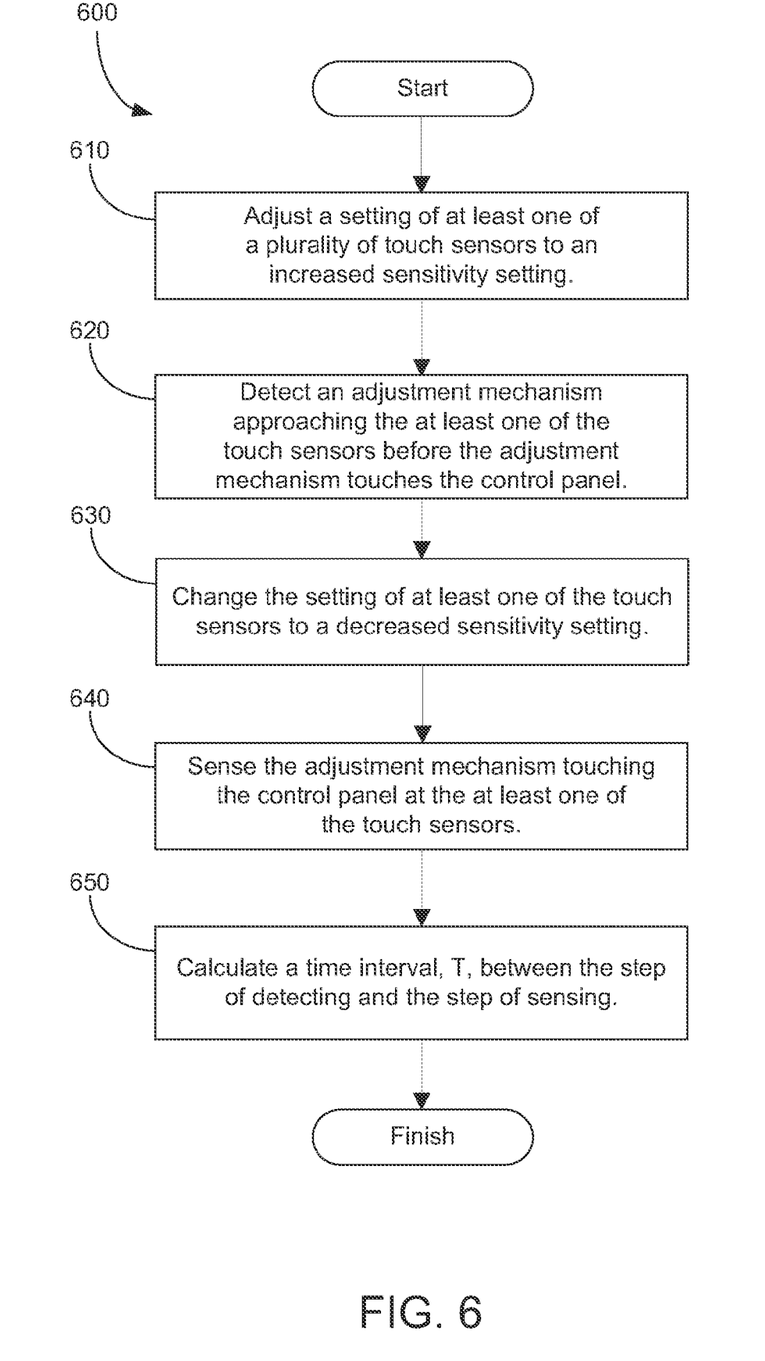
FIG. 6 illustrates a method for operating a control panel of an appliance according to an exemplary embodiment of the present subject matter.

FIG. 6 illustrates a method 600 for operating a control panel of an appliance according to an exemplary embodiment of the present subject matter. Method 600 can be utilized to operate any suitable control panel, such as control panel 200 (FIG. 2) or control panel 160 (FIG. 1). As an example, method 600 can be implemented by controller 150. Utilizing method 600, usage of control panel 200 can be improved as discussed in greater detail below. Method 600 is similar to method 500 (FIG. 5) and is discussed below in light of the above discussion of method 500.

At step 610, a controller, such as controller 150 (FIG. 2), adjusts a setting of at least one of touch sensors 222 to a high or increased sensitivity setting. As discussed above, the adjustment mechanism need not touch front surface 212 of substrate 210 to trigger touch sensors 222 in the increased sensitivity setting. At step 620, the controller detects an adjustment mechanism approaching the at least one of the plurality of touch sensors 222 before the adjustment mechanism touches control panel 200, e.g., front surface 212 of substrate 210.

At step 630, the controller changes the setting of the at least one of touch sensors 222 to a low or decreased sensitivity setting after step 620. Thus, after the controller has detected the adjustment mechanism, the controller changes the setting of the at least one of touch sensors 222 to the decreased sensitivity setting. As discussed above, touch sensors 222 detect or trigger when the adjustment mechanism contacts control panel 200 in the decreased sensitivity setting. At step 640, the controller senses the adjustment mechanism touching control panel 200, e.g., front surface 212 of substrate 210 at the at least one of the plurality of touch sensors.

At step 650, the controller calculates a time interval, T, between step 620 and step 640. As an example, the controller can determine time interval T by starting a timer of the controller at step 620 and stopping the timer after step 640. With time interval T calculated at step 650, the controller can also calculate a velocity of the adjustment mechanism, e.g., in the manner described above for method 500. With time interval T and/or the velocity of the adjustment mechanism known, method 600 can provide improved operation of control panel 200, e.g., in the manner described above for method 500.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for operating a control panel of an appliance, the control panel having a plurality of touch sensors, the method comprising:

adjusting a setting of at least one of the plurality of touch sensors to an increased sensitivity setting with a controller of the appliance;

receiving a first signal from the at least one of the plurality of touch sensors at the controller when an adjustment mechanism approaches the at least one of the plurality of touch sensors;

changing the setting of the at least one of the plurality of touch sensors to a decreased sensitivity setting with the controller after said step of receiving;

receiving a second signal from the at least one of the plurality of touch sensors at the controller when the adjustment mechanism touches the control panel at the at least one of the plurality of touch sensors; and calculating a velocity of the adjustment mechanism based upon a time interval, T, between the first signal and the second signal with the controller.

2. The method of claim 1, wherein the at least one of the plurality of touch sensors detects the adjustment mechanism approaching the at least one of the plurality of touch sensors at a distance, D, from the at least one of the plurality of touch sensors in the increased sensitivity setting.

3. The method of claim 1, wherein said step of calculating comprises calculating the velocity of the adjustment mechanism by dividing distance D by time interval T.

4. The method of claim 1, further comprising determining time interval T between the first signal and the second signal by starting a timer of the appliance after said step of receiving the first signal and stopping the timer after said step of receiving the second signal.

5. The method of claim 1, further comprising adjusting a rate of change for a control panel input based upon the velocity of the adjustment mechanism.

6. The method of claim 1, wherein the control panel includes a substrate having a front surface and a back surface positioned opposite each other on the substrate, the plurality of touch sensors positioned at the back surface of the substrate.

7. The method of claim 1, wherein said step of receiving the second signal comprises receiving the second signal from the at least one of the plurality of touch sensors when the adjustment mechanism touches the front surface of the substrate at the at least one of the plurality of touch sensors.

8. The method of claim 1, wherein the plurality of touch sensors comprise a plurality of capacitive touch sensors.

9. The method of claim 1, wherein the adjustment mechanism is a finger.

10. A method for operating a control panel of an appliance, the control panel having a plurality of touch sensors, the method comprising:

adjusting a setting of at least one of the plurality of touch sensors to an increased sensitivity setting with a controller of the appliance;

detecting an adjustment mechanism approaching the at least one of the plurality of touch sensors with the at least one of the plurality of touch sensors before the adjustment mechanism touches the control panel;

changing the setting of the at least one of the plurality of touch sensors to a decreased sensitivity setting with the controller after said step of detecting;

sensing the adjustment mechanism touching the control panel at the at least one of the plurality of touch sensors with the at least one of the plurality of touch sensors; and calculating a time interval, T, between said step of detecting and said step of sensing with the controller.

11. The method of claim 10, wherein the at least one of the plurality of touch sensors detects the adjustment mechanism approaching the at least one of the plurality of touch sensors at a distance, D, from the at least one of the plurality of touch sensors in the increased sensitivity setting.

12. The method of claim 11, further comprising determining a velocity of the adjustment mechanism by dividing distance D by time interval T.

13. The method of claim 10, wherein said step of calculating time interval T between said step of detecting and said step of sensing comprises starting a timer of the appliance after said step of detecting and stopping the timer after said step of sensing.

14. The method of claim 10, further comprising adjusting a rate of change for a control panel input based upon the velocity of the adjustment mechanism.

15. The method of claim 10, wherein the control panel includes a substrate having a front surface and a back surface positioned opposite each other on the substrate, the plurality of touch sensors positioned at the back surface of the substrate.

16. The method of claim 10, wherein said step of sensing comprises sensing the adjustment mechanism touching the front surface of the substrate at the at least one of the plurality of touch sensors.

17. The method of claim 10, wherein the plurality of touch sensors comprise a plurality of capacitive touch sensors.

18. The method of claim 10, wherein the adjustment mechanism is a finger.

19. An appliance, comprising:
a control panel having a front surface and a back surface positioned opposite each other on said control panel, said control panel having a plurality of capacitive touch sensors positioned at the back surface of said control panel;
a controller in communication with the plurality of capacitive touch sensors of said control panel, said controller comprising a processor and a memory, the memory including instructions to be executed by the processor, the instructions comprising
    adjusting a setting of at least one of the plurality of capacitive touch sensors to an increased sensitivity setting;
    receiving a first signal from the at least one of the plurality of capacitive touch sensors when a triggering mechanism approaches the front surface of said control panel;
    changing the setting of the at least one of the plurality of capacitive touch sensors to a decreased sensitivity setting after said step of receiving;
    receiving a second signal from the at least one of the plurality of capacitive touch sensors when the triggering mechanism touches the front surface of said control panel; and
    determining a time interval, T, between the first signal and the second signal.

\* \* \* \* \*